United States Patent [19]

Kishi et al.

[11] Patent Number: 4,623,751
[45] Date of Patent: Nov. 18, 1986

[54] PHOTOVOLTAIC DEVICE AND ITS MANUFACTURING METHOD

[75] Inventors: Yasuo Kishi; Hiroyuki Taniguchi; Souichi Sakai; Hitoshi Katoh; Atsuo Mizukami, all of Osaka, Japan

[73] Assignee: Sanyo Electric Co., Ltd., Japan

[21] Appl. No.: 617,724

[22] Filed: Jun. 6, 1984

[51] Int. Cl.$^4$ .................. H01L 27/14; H01L 31/18
[52] U.S. Cl. ............................. 136/244; 136/256; 136/258; 29/572
[58] Field of Search .......... 29/572; 136/244, 249 MS, 136/258 AM, 256

[56] References Cited

U.S. PATENT DOCUMENTS 4,243,432 1/1981 Jordan et al. .................. 136/244
4,532,371 7/1985 Hanak et al. ................... 136/249

FOREIGN PATENT DOCUMENTS 56-13778 2/1981 Japan .................. 136/258 AM

Primary Examiner—Aaron Weisstuch
Attorney, Agent, or Firm—Darby & Darby

[57] ABSTRACT

A method of manufacturing a photovoltaic device having a plurality of a photoelectric converting regions formed on an insulating surface of a substrate electrically connected in series, comprises the steps of dividing a first large area electrode layer on an insulating surface of a substrate into a plurality of first electrode layer portions corresponding to a plurality of photoelectric converting regions, depositing in succession a film-like photoelectric semiconductor layer and a second electrode layer lying continuously on the divided first electrode layers, and removing portions of the photoelectric semiconductor layer and the second electrode layer formed continuously to divide them into a plurality of portions corresponding to the plurality of the photoelectric converting regions.

4 Claims, 11 Drawing Figures

PHOTOVOLTAIC DEVICE AND ITS MANUFACTURING METHOD

BACKGROUND OF THE INVENTION

1. Field of the Invention

The present invention relates to a method of manufacturing a photovoltaic device for directly converting light energy such as solar rays to electric energy.

2. Description of the Prior Art

While exhaustion of energy resources has become a problem, photovoltaic devices such as solar cells for directly converting light energy to electric energy have been developed, inasmuch as they utilize the inexhaustible solar rays as a major energy source.

FIG. 1 is a perspective view showing a portion of a photovoltaic device manufactured in accordance with a conventional method. Referring to FIG. 1, the device shown comprises an insulating substrate 1 of glass, transparent plastic or the like, and a plurality of photoelectric converting regions 2a, 2b, 2c formed side-by-side on a main surface of the insulating substrate 1. The converting regions 2a, 2b, 2c comprise first electrode layers 3a, 3b, 3c of a transparent conductive oxide material such as tin oxide ($SnO_2$), indium tin oxide ($In_2O_3$—$SnO_2$), or the like formed on the insulating substrate 1, film-like photoelectric semiconductor layers 4a, 4b, 4c of amorphous silicon or the like having a PIN junction structure, the regions of which are arranged in the order of PIN from the light receiving side, and formed on the first electrodes 3a, 3b, 3c, respectively, and second electrode layers 5a, 5b, 5c of aluminum or the like in ohmic contact with the photoelectric semiconductor layers 4a, 4b, 4c, respectively, thereby to form a layered structure including the above described layers.

FIG. 2 is an enlarged sectional view of a major portion of the device shown in FIG. 1. As better seen in FIG. 2, the photoelectric converting regions 2a, 2b, 2c provided side by side as described above are adapted such that extensions 5a', 5b' of the second electrode layers 5a, 5b extending from the upper surfaces of the photoelectric semiconductor layers 4a and 4b are directly coupled to exposed portions 3b', 3c' of the first electrode layers 3b, 3c exposed on the insulating substrate 1 from the lower surface of the right adjacent photoelectric semiconductor layers 4b, 4c, respectively, whereby the plurality of photoelectric converting regions 2a, 2b, 2c are electrically connected in series.

One of the factors influencing the light utilization efficiency in such device is the ratio of the total area of the photoelectric converting regions 2a, 2b, 2c actually contributing to photoelectric conversion with respect to the light receiving area of the whole device, i.e. the area of the substrate. However, the isolating regions inevitably existing in the spaces between the respective adjacent photoelectric converting regions 2a, 2b, 2c reduce the above described ratio of the areas.

Accordingly, in order to improve the light utilization efficiency, it is necessary to reduce the isolating regions of the spaces between the respective adjacent photoelectric converting regions 2a, 2b, 2c. Reduction of such spaces, however, is determined by the precision in formation of the respective layers and accordingly a photoetching technology of very high resolution is desired. In the case of such technology, the steps of depositing the first large area electrode layer on the whole surface of the substrate 1, and dividing the same into the individual first electrode layers 3a, 3b, 3c by means of a photoresist and etching or removing the spaces between the respective adjacent first electrode layers 3a, 3b, 3c, are carried out in succession and then the similar steps of depositing and removing are again repeated for the photoelectric semiconductor layer 4a, 4b, 4c and the second electrode layers 5a, 5b, 5c.

However, since the above described photoetching technology involves a wet process such as rinsing, it could happen that pin holes are formed in the film-like photoelectric semiconductor layers 4a, 4b, 4c, in which case the material of the second electrodes to be deposited in the subsequent step contacts the first electrode layers 3a, 3b, 3c through such pin holes. As a result, defects occur in which the first electrode layers 3a, 3b, 3c are electrically short-circuited to the second electrode layers 5a, 5b, 5c facing the first electrode layers 3a, 3b, 3c with the photoelectric semiconductor layers 4a, 4b, 4c of the corresponding photoelectric converting regions 2a, 2b, 2c sandwiched therebetween. Furthermore, there is concern that the contacting surfaces of the photoelectric semiconductor layers 4a, 4b, 4c with which the second electrode layers 5a, 5b, 5c are in ohmic contact are degraded by formation and removal of a photoresist and by rinsing in the above described photoetching technology, even if the same are not damaged to the extent that pin holes are formed. Furthermore even a slight amount of moisture left after rinsing could cause corrosion of the second electrode layers 5a, 5b, 5c to be deposited in the subsequent step.

SUMMARY OF THE INVENTION

Accordingly, a primary object of the present invention is to provide a method of manufacturing a photovoltaic device of such a structure as described above employing an etching process of high resolution which avoids short-circuits due to pin holes, degradation of the films in the contacting surfaces of the photoelectric semiconductor layers, and corrosion of the second electrode layers.

Briefly described, the invention concerns a method of manufacturing such a photovoltaic device in which a plurality of a photoelectric converting regions formed on an insulating surface of a substrate are electrically connected in series, and comprises the steps of dividing a first large area electrode layer on an insulating surface of a substrate into a plurality of first electrode layer portions corresponding to a plurality of photoelectric converting regions, depositing in succession a film-like semiconductor layer and a second electrode layer lying continuously on the divided first electrode layers, and removing portions of the photoelectric semiconductor layer and the continuous second electrode layer thereby to divide them into a plurality of portions corresponding to the plurality of the photoelectric converting regions.

According to the present invention, a photovoltaic device having a plurality of photoelectric converting regions electrically connected in series and formed on an insulating surface of a substrate is manufactured by removing portions of a second large area electrode layer after deposition thereof for dividing the same into a plurality of photoelectric converting regions. As a result, the second electrode layer serves as a protecting layer during etching of the photoelectric semiconductor layer, whereby an etching technology having high resolution can be employed without causing short-circuiting through pin holes, degradation of the films and corrosion, with the result that the light utilization efficiency can be enhanced.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
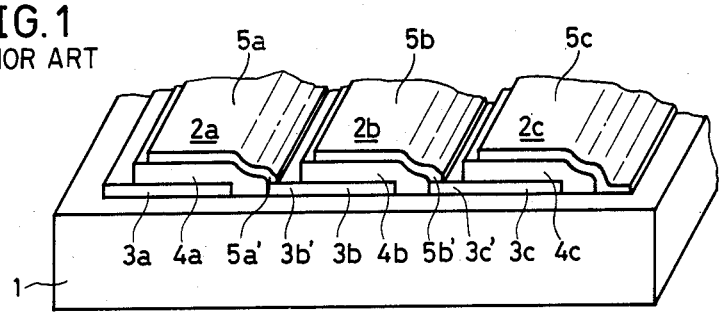
FIG. 1 is a perspective view showing a portion of a photovoltaic device manufactured in accordance with a conventional method.
Figure 2:
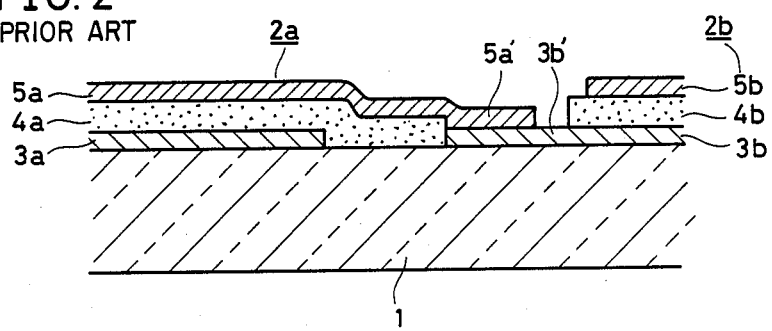
FIG. 2 is an enlarged sectional view of a major portion of the device shown in FIG. 1.
Figure 3:
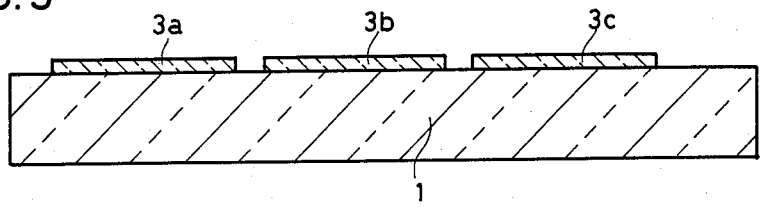
FIGS. 3 to 9 are sectional views for explaining the steps of the inventive manufacturing method.
Figure 4:
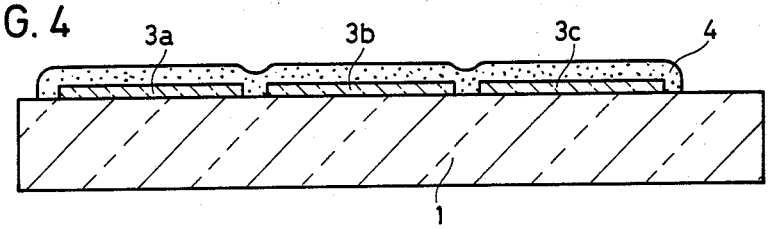
Figure 5:
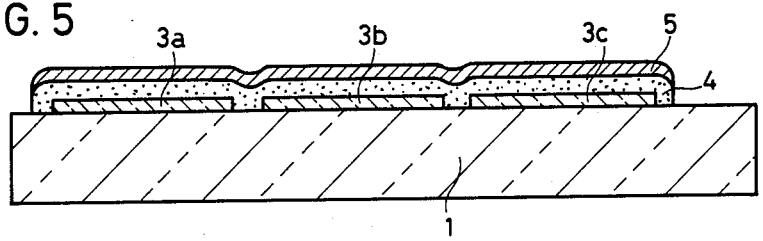
Figure 6:
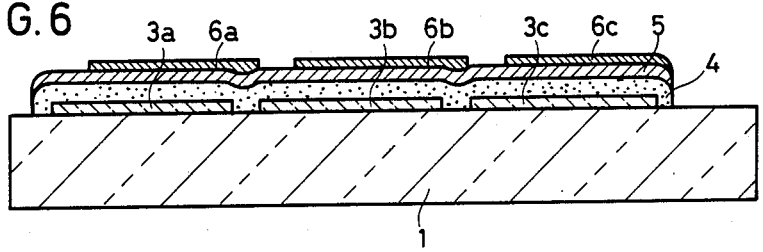

FIGS. 3 to 9 are sectional views of a device at several different stages in manufacturing the same in accordance with the present invention. In the first step shown in FIG. 3, a transparent insulating substrate 1 is deposited on the whole main surface thereof with a large area transparent oxide electrode layer of a material such as $SnO_2$, $In_2O_3$—$SnO_2$, or the like by means of an electron beam evaporation process and the deposited oxide electrode layer is divided into three first electrode layers 3a, 3b, 3c by means of a photoetching process. In the second step shown in FIG. 4, a film-like photoelectric semiconductor layer 4 is deposited continually over the thus divided first electrode layers 3a, 3b, 3c, as seen in FIG. 4. In the case where the film-like photoelectric semiconductor layer 4 is formed as a layer of amorphous silicon having a thickness in the range of submicron to several microns, the amorphous silicon layer is formed by a well known plasma reaction in a silane atmosphere. In the third step shown in FIG. 5, an aluminum film serving as a second electrode layer 5 is formed by evaporation on the photoelectric semiconductor layer 4 formed on the whole surface.

The photoelectric semiconductor layer 4 and the second electrode layer 5 thus layered continuously on the whole surface of the thus divided first electrode layers 3a, 3b, 3c are subjected to formation of a photoresist layer on the whole surface of the second electrode layer 5, whereupon the photoresist layer is exposed through a photomask and the exposed or unexposed portions are removed, thereby to form photoresist layers 6a, 6b, 6c.

Figure 7:
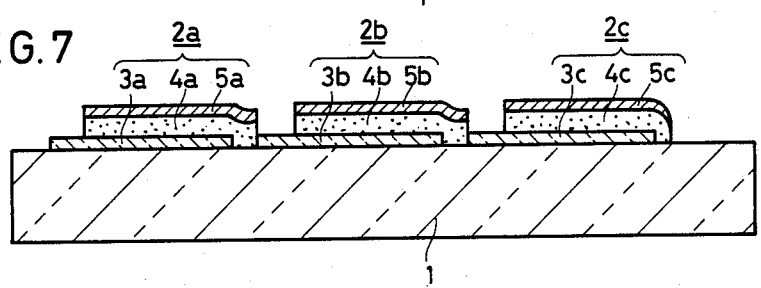

Then in the fifth step shown in FIG. 7, the second electrode layer 5 and the photoelectric semiconductor layer 4 are removed by etching the same in the depth direction using the above described photoresist layers 6a, 6b, 6c as a mask and using a suitable etchant, whereby the same are divided into a plurality of photoelectric converting regions 2a, 2b, 2c, while the left hand portions of the first electrode layers 3a, 3b, 3c are exposed. More specifically, the respective photoelectric semiconductor layers 4a, 4b, 4c are protected, since the above described second electrode layers 5a, 5b, and 5c serve as a protecting film, due to the fact that a large area second electrode layer is first deposited and then the same is divided into predetermined shapes. As a result, pin holes likely to occur due to a wet process which the photoelectric semiconductor layers 4a, 4b, 4c undergo are suppressed from occurring. At the same time, since the second electrode layer 5 is formed by evaporation on the electrode contacting surface of the photoelectric semiconductor layer 4 immediately after layer 4 is formed, degradation of the film quality and corrosion of the second electrode layers 5a, 5b, 5c are not caused.

Figure 8:
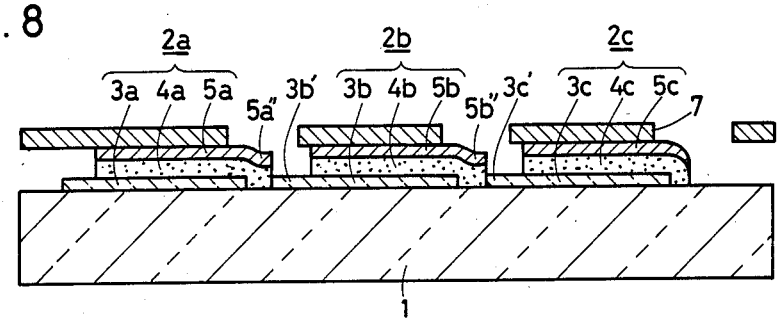
Figure 9:
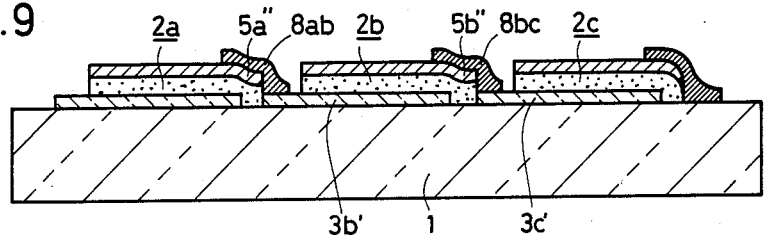

In the final step shown in FIG. 8, excluding the portions 3b', 3c' exposed by etching of the photoelectric semiconductor layers 4a, 4b, 4c and the second electrode layers 5a, 5b, 5c, and the exposed end portions 5a'', 5b'' of the second electrode layers 5a, 5b of the photoelectric converting regions 2a, 2b lying adjacent to the exposed portions 3b', 3c', the surface is covered with a metal or a ceramic mask 7, whereupon a metal layer such as of aluminum is deposited by evaporation, whereby coupling electrode layers 8ab, 8bc are formed for electrically coupling the exposed portions 3b', 3c' to the left hand portions 5a'', 5b'' of the second electrode layers 5a, 5b. As a result, the respective adjacent ones of the photoelectric converting regions 2a, 2b, 2c are electrically connected in series, as seen in FIG. 9.

Although the above described coupling electrode layers 8ab, 8bc are deposited through the mask 7, the coupling electrode layers 8ab, 8bc electrically couple the exposed portions 3b', 3c' of the first electrode layers 3b, 3c and the second electrode layers 5a, 5b, reduction of the light utilization efficiency due to decreased resolution of the mask evaporation technology is of no problem.

Figure 10:
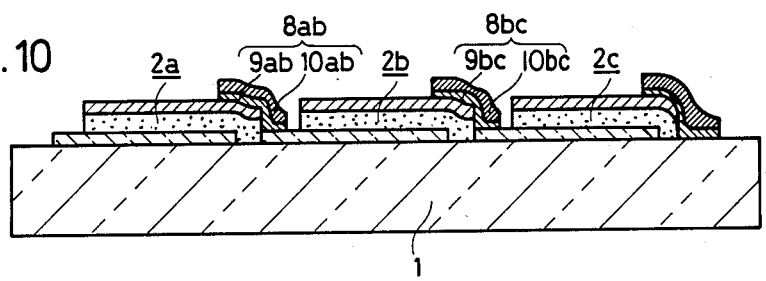
FIG. 10 is a sectional view of another photovoltaic device manufactured in the inventive manufacturing method.
Figure 11:
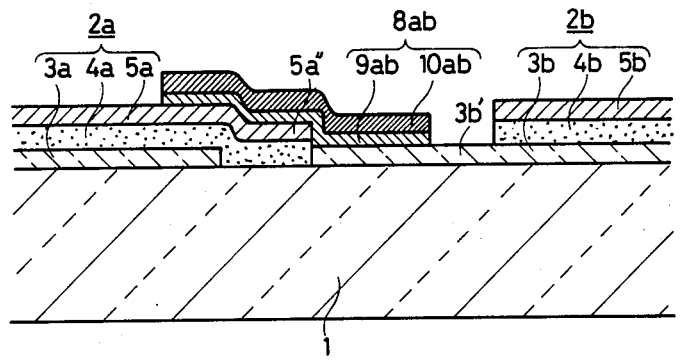
FIG. 11 is an enlarged sectional view of a major portion of the device shown in FIG. 10.

FIG. 10 is a sectional view of a photovoltaic device of another embodiment manufactured in accordance with the inventive manufacturing method. The embodiment shown in FIG. 10 is different from the above described embodiment in the structure of the coupling electrode layers 8ab, 8bc. More specifically, if low cost aluminum is utilized as the material for the coupling electrodes, there is concern that the aluminum causes an oxidation reaction on the coupling surface with the transparent conductive oxide electrode material such as $SnO_2$, $In_2O_3$—$SnO_2$ or the like constituting the first electrode, whereby a resistance layer comprising a film of alumina ($Al_2O_3$) is formed, resulting in a power loss. Therefore, coupling surface layers 9ab, 9bc of the above described coupling electrode layers 8ab, 8bc are, as better shown in FIG. 11, made of a non-oxidizing metal, such as platinum, gold, silver, titanium, nickel, or the like, or an alloy comprising at least one of the above described metals. In FIGS. 10 and 11, the reference characters 10ab, 10bc denote aluminum electrode layers deposited on the above described coupling surface layer for reducing the sheet resistance of the coupling electrode layers 8ab, 8bc as a whole.

Furthermore, in the case where the degree of humidity resistance of the second electrode layers 5a, 5b, 5 c becomes a problem, the above described second electrode layers 5a, 5b, 5c may be covered by extending the coupling surface layers 9ab, 9bc made of the above described non-oxidizing metal.

Similarly, in the case where the humidity resistance of the above described layered electrodes 10ab, 10bc of aluminum becomes a problem, a protecting metallic film may be coated on the above described layered electrodes 10ab, 10bc.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a photovoltaic device having a plurality of separate photoelectric converting regions formed on an insulating surface of a substrate and electrically connected in series, said method comprising the steps of:

forming a plurality of spaced-apart first electrode layers including oxygen in the form of an oxide on said insulating surface, each being associated with one of said plurality of photoelectric converting regions;

successively forming a film-like photoelectric semiconductor layer and a second electrode layer continuously covering said first, spaced-apart electrode layers;

removing portions of said photoelectric semiconductor layer and said second electrode layer substantially simultaneously to divide said photoelectric semiconductor layer and said second electrode layer into a plurality of separate portions, each of said portions corresponding to one of said photoelectric converting regions;

depositing a coupling electrode layer through a removable apertured mask to implement said series electrical connection of said separate photoelectric converting regions, said apertured mask being in contact with (a) portions of said first electrode layers exposed by said removal of portions of said photoelectric semiconductor layer and said second electrode layer, and (b) with said second electrode layer of the adjacent photoelectric converting regions;

said coupling electrode having a coupling surface in contact with adjacent said first and second spaced-apart electrode layers, the step of depositing said coupling electrode layer comprising the step of depositing a multiple layer structure of (1) a non-oxidizing metal layer selected from the group consisting of platinum, gold, silver, titanium, nickel, platinum alloys, gold alloys, silver alloys, titanium alloys, and nickel alloys, and (2) an overlying layer of aluminum;

whereby said non-oxidizing metal layer prevents oxidation of said aluminum layer through contact with the oxygen included in said first electrode layer in the form of oxide.

2. The method according to claim 1 wherein said first electrode is formed to be transparent.

3. A photovoltaic device of the type having a plurality of separate photoelectric converting regions formed on an insulating surface of a substrate, said photoelectric converting regions being electrically connected in series, comprising:

a plurality of spaced-apart first electrode layers containing oxygen in the form of an oxide disposed on said insulating surface of said substrate, each of said spaced-apart first electrode layers corresponding to one of said plurality of photoelectric converting regions;

a plurality of film-like photoelectric semiconductor layers including amorphous silicon disposed over said first spaced-apart electrode layers, respectively;

a second electrode layer disposed over and contacting each of said plurality of said film-like photoelectric semiconductor layers; and a coupling electrode layer disposed between said first electrode layers and said second electrode layer of adjacent photoelectric converting regions for forming a series electrical connection therebetween, wherein said coupling electrode layer is comprised of (1) a substantially non-oxidizing metal layer selected from the group consisting of platinum, gold, silver, titanium, nickel, platinum alloys, gold alloys, silver alloys, titanium alloys and nickel alloys, and (2) an overlying layer of aluminum;

whereby said non-oxidizing metal layer prevents oxidation of said aluminum layer through contact with the oxygen included in said first electrode layer in the form of oxide.

4. The photovoltaic device according to claim 3 wherein said plurality of said first spaced-apart electrodes is transparent.

* * * * *